(12) United States Patent
Kwon et al.

(10) Patent No.: US 11,284,538 B2
(45) Date of Patent: Mar. 22, 2022

(54) ELECTRONIC DEVICE INCLUDING COMPOSITE HEAT DISSIPATION MEMBER AND METHOD OF MANUFACTURING THE SAME

(71) Applicant: Samsung Electronics Co., Ltd., Suwon-si (KR)

(72) Inventors: Ohhyuck Kwon, Suwon-si (KR); Min Park, Suwon-si (KR); Jaeyoung Huh, Suwon-si (KR); Daesuk Kang, Suwon-si (KR); Ji Eom, Suwon-si (KR); Ewidon Jeong, Suwon-si (KR); Sungchul Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/988,980

(22) Filed: Aug. 10, 2020

(65) Prior Publication Data
US 2021/0059076 A1    Feb. 25, 2021

(30) Foreign Application Priority Data

Aug. 19, 2019 (KR) .................. 10-2019-0100901

(51) Int. Cl.
*H05K 7/20* (2006.01)
*G06F 1/20* (2006.01)
*H01Q 1/02* (2006.01)

(52) U.S. Cl.
CPC ......... *H05K 7/20445* (2013.01); *G06F 1/203* (2013.01); *H01Q 1/02* (2013.01)

(58) Field of Classification Search
CPC ............ H05K 7/20445; H05K 7/2039; H05K 1/0203; H05K 7/205; H05K 2201/10098; H05K 7/20; G06F 1/203; H01Q 1/02; H01L 2924/1421; B29L 2031/3456
See application file for complete search history.

(56) References Cited

U.S. PATENT DOCUMENTS

| | | | | |
|---|---|---|---|---|
| 5,099,254 | A * | 3/1992 | Tsukii ............... | H01Q 1/002 343/853 |
| 5,940,031 | A * | 8/1999 | Turlington ............ | G01S 7/034 342/372 |
| 6,876,323 | B2 * | 4/2005 | Feldle ................ | H01Q 21/0025 342/157 |
| 8,164,541 | B2 * | 4/2012 | Van Der Poel ...... | H01Q 21/065 343/893 |
| 9,735,826 | B2 * | 8/2017 | Sohn .................. | H04B 1/3888 |
| 9,812,768 | B2 * | 11/2017 | Youm ................. | H01Q 1/243 |
| 10,141,625 | B1 | 11/2018 | Ryu et al. | |
| 10,290,923 | B2 * | 5/2019 | Choi ................... | H01Q 1/24 |

(Continued)

FOREIGN PATENT DOCUMENTS

KR   10-2016-0009496 A   1/2016

*Primary Examiner* — Michael A Matey

(57) ABSTRACT

A composite heat dissipation member and an electronic device comprising the composite heat dissipation member. The composite head dissipation member may include a first heat dissipation sheet disposed to be overlapped with an antenna module, and a second heat dissipation sheet disposed adjacent to the first heat dissipation sheet without an overlap with the first heat dissipation sheet, thermally connected to the first heat dissipation sheet, and having a higher thermal conductivity than the first heat dissipation sheet.

18 Claims, 12 Drawing Sheets

(56) References Cited

U.S. PATENT DOCUMENTS

| | | | |
|---|---|---|---|
| 10,617,033 B2* | 4/2020 | Min | G06F 1/1635 |
| 10,842,047 B1* | 11/2020 | Egami | H01Q 1/02 |
| 10,916,495 B2* | 2/2021 | Choi | H01L 24/20 |
| 11,013,150 B2* | 5/2021 | Kim | H05K 9/0024 |
| 2006/0090489 A1* | 5/2006 | Haws | H05K 7/20309 |
| | | | 62/176.6 |
| 2008/0169973 A1* | 7/2008 | Pluymers | G01S 7/032 |
| | | | 342/175 |
| 2012/0033383 A1* | 2/2012 | Jones | H01Q 1/02 |
| | | | 361/701 |
| 2012/0068906 A1* | 3/2012 | Asher | H01Q 21/0025 |
| | | | 343/853 |
| 2013/0321239 A1* | 12/2013 | Bingham | H01Q 5/40 |
| | | | 343/879 |
| 2016/0113146 A1* | 4/2016 | Rowe | H05K 7/20154 |
| | | | 361/695 |
| 2018/0240734 A1* | 8/2018 | Liao | H01L 23/36 |
| 2018/0288908 A1* | 10/2018 | Lee | H05K 1/181 |
| 2018/0358686 A1* | 12/2018 | Park | H01Q 9/42 |
| 2019/0006731 A1* | 1/2019 | Chiu | G06F 1/20 |
| 2019/0051967 A1* | 2/2019 | Ryu | H05K 1/028 |
| 2019/0082555 A1* | 3/2019 | Hooton | F28F 21/085 |
| 2019/0148256 A1* | 5/2019 | Jung | H01L 24/19 |
| | | | 257/712 |
| 2019/0171923 A1* | 6/2019 | Finn | B32B 7/12 |
| 2019/0223285 A1* | 7/2019 | Sivano De Sousa | |
| | | | H01L 23/3735 |
| 2020/0020478 A1* | 1/2020 | Nishimura | H01F 27/22 |

* cited by examiner

ELECTRONIC DEVICE INCLUDING COMPOSITE HEAT DISSIPATION MEMBER AND METHOD OF MANUFACTURING THE SAME

CROSS-REFERENCE TO RELATED APPLICATION

This application is based on and claims priority under 35 U.S.C. 119 to Korean Patent Application No. 10-2019-0100901, filed on Aug. 19, 2019, in the Korean Intellectual Property Office, the disclosures of which are herein incorporated by reference in their entireties.

BACKGROUND

1. Field

The disclosure relates to an electronic device including a composite heat dissipation member and a method of manufacturing the same.

2. Description of Related Art

Electronic devices can transmit and receive various data using a wireless communication system. Currently, in order to meet the increasing demand for wireless data traffic or achieve a high data transfer rate, wireless communication systems are being studied in a super-high frequency band. In addition, research is being conducted for effective heat dissipation from an antenna module so as to realize a smooth operation of a wireless communication system implemented in a super-high frequency band.

A wireless communication system using a low frequency band could utilize a metal radiator inside or outside an electronic device, but a wireless communication system implemented in a super-high frequency band may embed an antenna module including a dipole antenna and a patch antenna inside an electronic device. The antenna module generates in general a lot of heat, so heat dissipation is important. However, because of the characteristics of a super-high frequency band, it may be difficult to dispose a heat dissipation structure, that may affect radiation performance, in the vicinity of the antenna module.

In addition, the electronic device may include at least one electronic component (e.g., a processor) disposed therein and generating a lot of heat. In order to effectively dissipate such heat, a heat dissipation member may be disposed around the electronic component(s). However, the heat dissipation member may have a high thermal conductivity and an electromagnetic interference shielding characteristic, thereby lowering the performance of an antenna disposed inside the electronic device. Thus, the arrangement structure of the heat dissipation member should be designed in consideration of the positional and functional relationship with the antenna while realizing an efficient heat dissipation operation.

SUMMARY

Various embodiments of the disclosure may provide a composite heat dissipation member, an electronic device including the composite heat dissipation member, and a method of manufacturing the composite heat dissipation member.

According to various embodiments, the composite heat dissipation member may be configured to effectively dissipate heat generated from a heat source.

According to various embodiments, the composite heat dissipation member may be configured to not only accomplish effective heat dissipation operation but also improve antenna radiation performance.

In addition, various embodiments may provide a structure and manufacturing method for heat dissipation from an antenna module of a wireless communication system implemented in a super-high frequency band.

According to various embodiments, a composite heat dissipation member may include a first heat dissipation sheet disposed to be overlapped with an antenna module, and a second heat dissipation sheet disposed adjacent to the first heat dissipation sheet without an overlap with the first heat dissipation sheet, thermally connected to the first heat dissipation sheet, and having a higher thermal conductivity than the first heat dissipation sheet.

According to various embodiments, an electronic device may include a housing, an antenna module embedded in the housing, and a composite heat dissipation member thermally connected at least to the antenna module, and the composite heat dissipation member may include a first heat dissipation sheet disposed to be overlapped with the antenna module, and a second heat dissipation sheet disposed adjacent to the first heat dissipation sheet without an overlap with the first heat dissipation sheet, thermally connected to the first heat dissipation sheet, and having a higher thermal conductivity than the first heat dissipation sheet.

According to various embodiments, a method for manufacturing a composite heat dissipation member may include stacking, on a base layer, a second heat dissipation sheet a portion of which is removed, disposing a first heat dissipation sheet in the removed portion of the second heat dissipation sheet, performing planarization to match the first heat dissipation sheet to a thickness of the second heat dissipation sheet, and curing the first heat dissipation sheet.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The above and other aspects, features and advantages of certain embodiments of the disclosure will be more apparent from the following detailed description, taken in conjunction with the accompanying drawings.

DETAILED DESCRIPTION

FIGS. 1 through 11, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

FIGS. 1 to 11C, discussed below, and the various embodiments used to describe the principles of the disclosure in this patent document are by way of illustration only and should not be construed in any way to limit the scope of the disclosure. Those skilled in the art will understand that the principles of the disclosure may be implemented in any suitably arranged system or device.

Hereinafter, embodiments of the disclosure are described in detail with reference to accompanying drawings.

Figure 1:
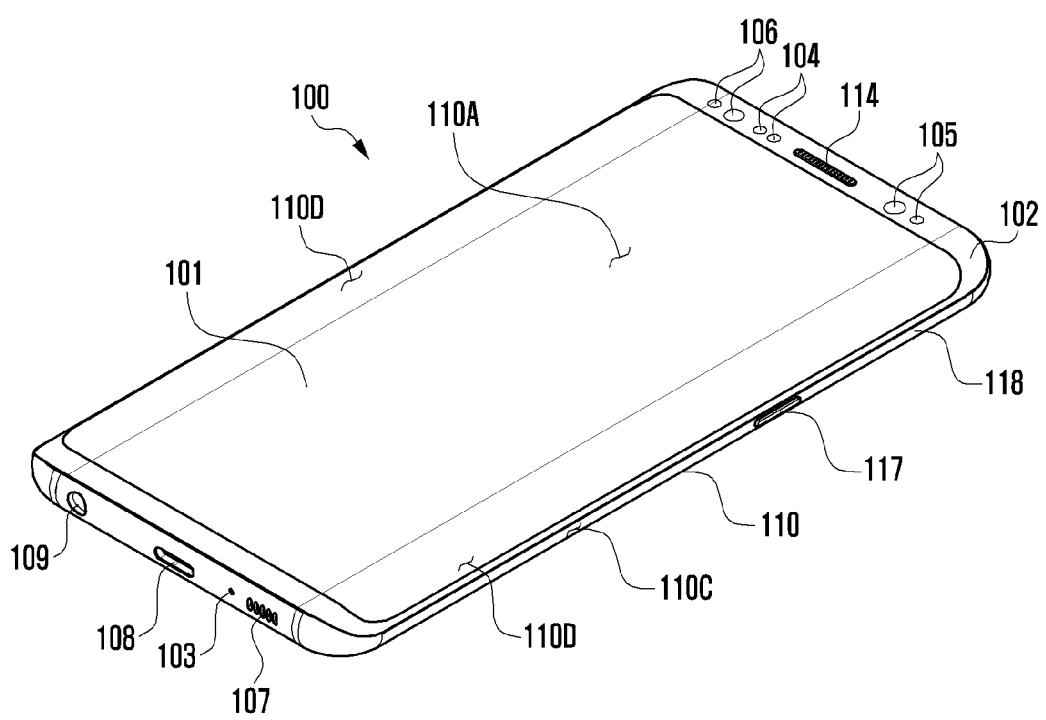
FIG. 1 illustrates a perspective view of a front surface of a mobile electronic device according to an embodiment of the disclosure.
Figure 2:
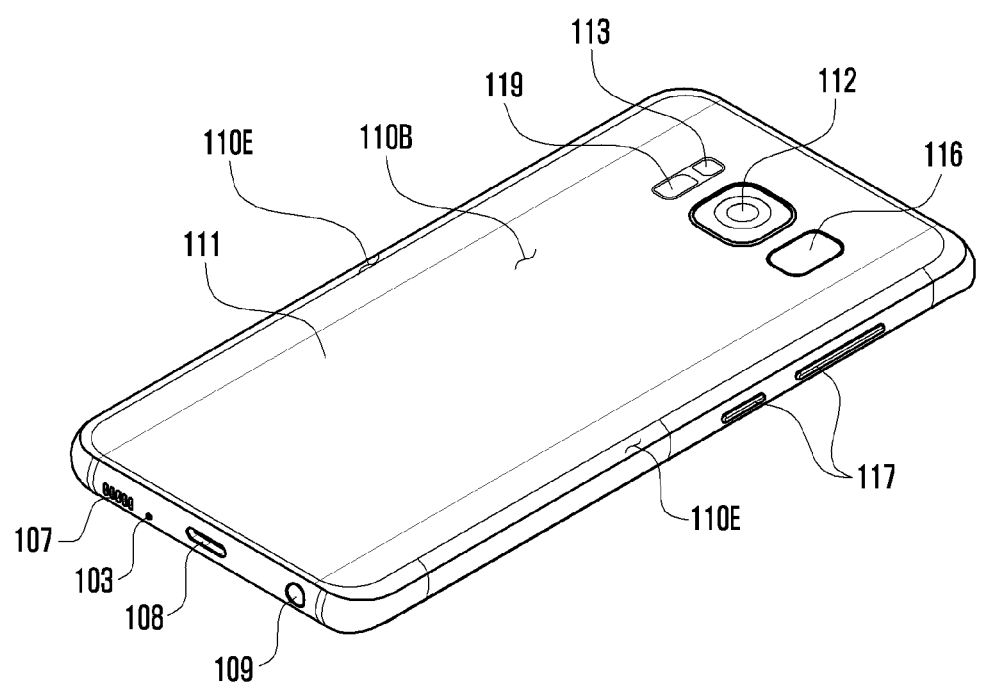
FIG. 2 illustrates a perspective view of a rear surface of the electronic device of FIG. 1 according to an embodiment of the disclosure.

FIG. 1 illustrates a perspective view showing a front surface of a mobile electronic device according to an embodiment of the disclosure, and FIG. 2 illustrates a perspective view showing a rear surface of the mobile electronic device shown in FIG. 1 according to an embodiment of the disclosure.

Referring to FIGS. 1 and 2, a mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules, sensor modules 104 and 119, camera modules, a key input device 117, a light emitting device 106, and connector holes 108 and 109. The mobile electronic device 100 may omit at least one (e.g., the key input device 117 or the light emitting device) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. Outlines (i.e., edges and corners) of the display 101 may have substantially the same form as those of the front plate 102. The spacing between the outline of the display 101 and the outline of the front plate 102 may be substantially unchanged in order to enlarge the exposed area of the display 101.

A recess or opening may be formed in a portion of a display area of the display 101 to accommodate at least one of the speaker hole 114, the sensor module 104, the first camera device 105, and the light emitting device. At least one of the speaker hole 114, the sensor module 104, the first camera device 105, a fingerprint sensor 116, and the light emitting element 106 may be disposed on the back of the display area of the display 101. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104 and 119 may generate electrical signals or data corresponding to an internal operating state of the mobile electronic device 100 or to an external environmental condition. The sensor modules 104 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules may include a first camera device 105 disposed on the first surface 110A of the electronic device 100, and a second camera device 112 and/or a flash 113 disposed on the second surface 110B. The first camera device 105 or the second camera device 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module disposed on the second surface 110B of the housing 110.

The light emitting device may be disposed on the first surface 110A of the housing 110. For example, the light emitting device may provide status information of the electronic device 100 in an optical form. The light emitting device may provide a light source associated with the operation of the first camera device 105. The light emitting device may include, for example, a light emitting diode (LED), an IR LED, or a xenon lamp.

The connector holes 108 and 109 may include a first connector hole 108 adapted for a connector (e.g., a universal serial bus (USB) connector) for transmitting and receiving power and/or data to and from an external electronic device, and/or a second connector hole 109 adapted for a connector (e.g., an earphone jack) for transmitting and receiving an audio signal to and from an external electronic device.

Some of the first or second camera devices 105 and 112, some sensor modules of sensor modules 104 and 119, or an indicator may be arranged to be exposed through a display 101. For example, the first camera device 105, the sensor module 104, or the indicator may be arranged in the internal space of an electronic device 100 so as to be brought into contact with an external environment through an opening of the display 101, which is perforated up to a front plate 102. In another embodiment, some sensor modules 104 may be arranged to perform their functions without being visually exposed through the front plate 102 in the internal space of the electronic device. For example, in this case, an area of the display 101 facing the sensor module may not require a perforated opening.

Figure 3:
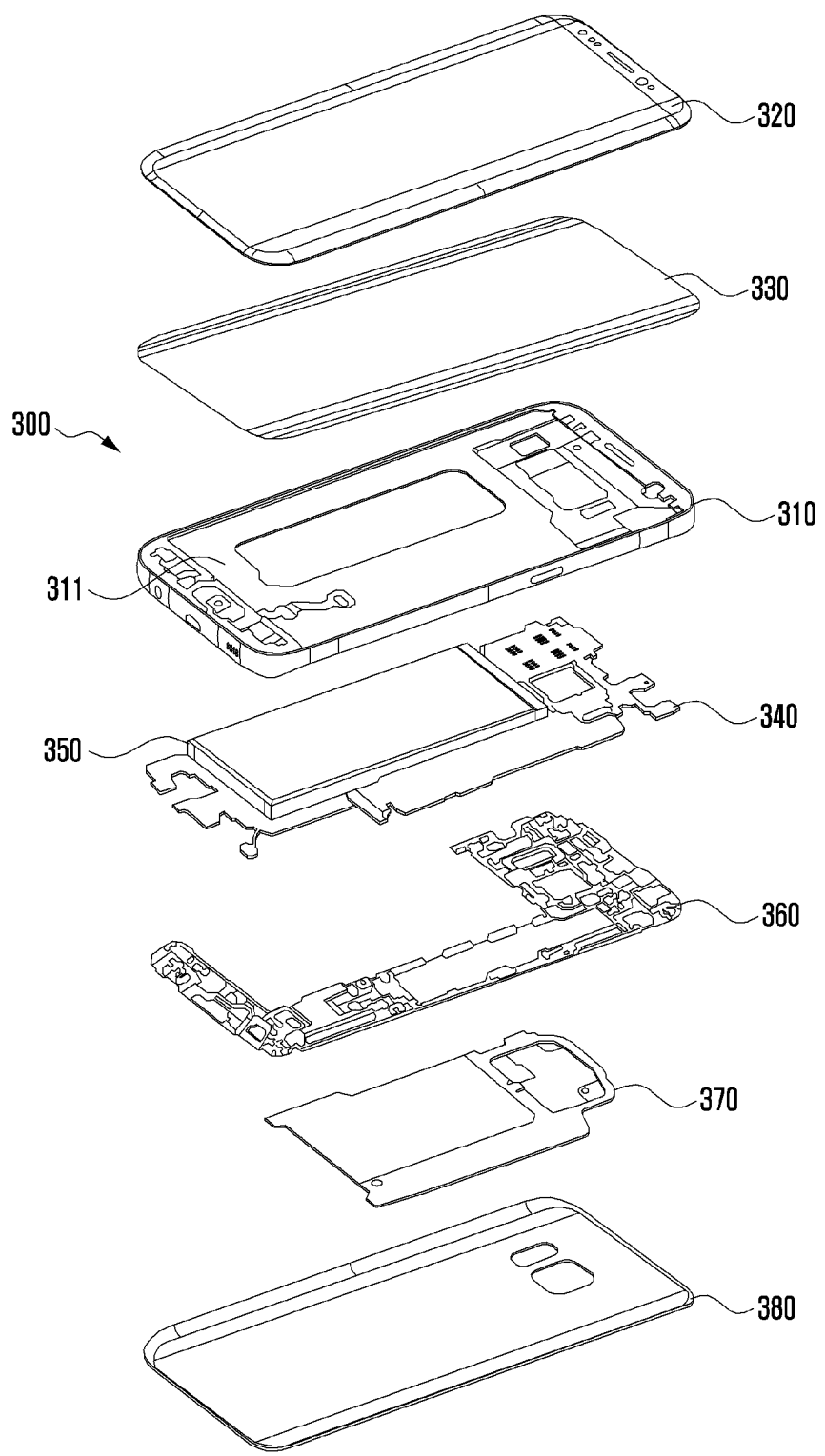
FIG. 3 illustrates an exploded perspective view of the electronic device of FIG. 1 according to an embodiment of the disclosure.

FIG. 3 illustrates an exploded perspective view showing a mobile electronic device shown in FIG. 1 according to an embodiment of the disclosure.

Referring to FIG. 3, a mobile electronic device 300 may include a lateral bezel structure 310, a first support member 311 (e.g., a bracket), a front plate 320, a display 330, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the electronic device 300 may be the same as or similar to those of the mobile electronic device 100 shown in FIG. 1 or FIG. 2, thus, descriptions thereof are omitted below.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 330 at one side thereof and also combined with the printed circuit board (PCB) 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, one or more of a volatile memory and a non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

Figure 4:
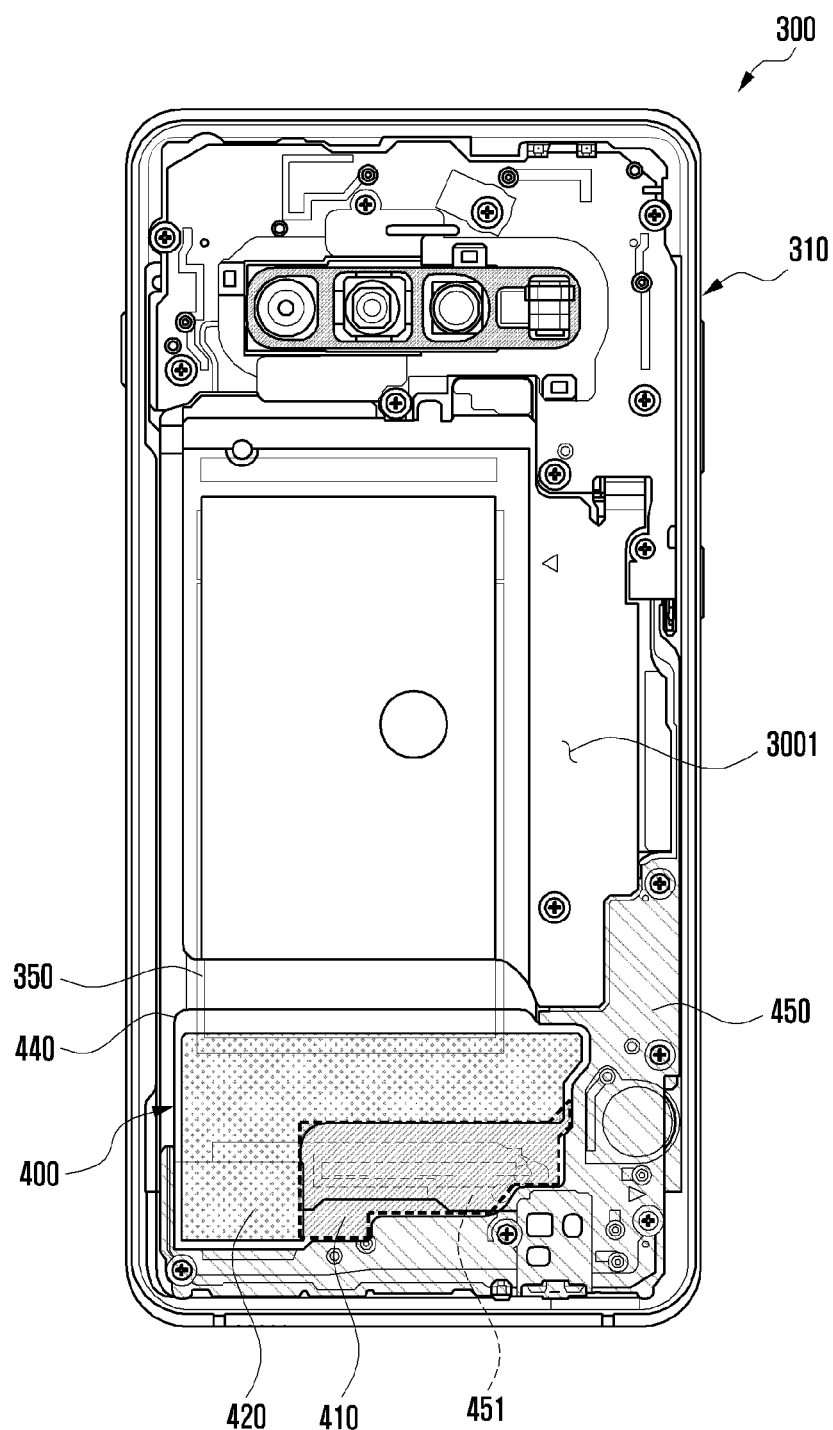
FIG. 4 illustrates a plan view of a state in which a composite heat dissipation member according to an embodiment of the disclosure is disposed in an electronic device.
Figure 5:
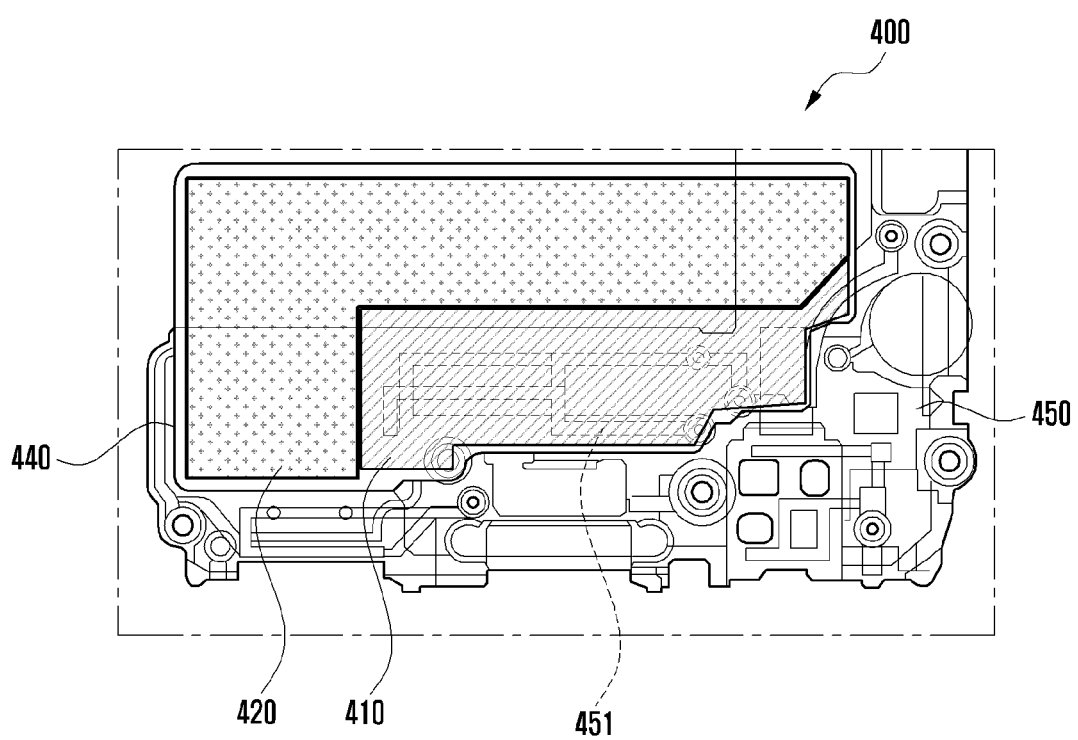
FIG. 5 illustrates an enlarged view of a portion in which a composite heat dissipation member according to an embodiment of the disclosure is disposed.

FIG. 4 illustrates a plan view of a state in which a composite heat dissipation member 400 according to an embodiment of the disclosure is disposed in an electronic device 300, and FIG. 5 is an enlarged view illustrating a portion in which the composite heat dissipation member 400 according to an embodiment of the disclosure is disposed. FIG. 4 shows an internal structure of the electronic device 300 in a state where a rear plate (e.g., the rear plate 380 in FIG. 3) of the electronic device 300 is removed.

Referring to FIG. 4, the electronic device 300 may include the composite heat dissipation member 400 disposed in an inner space 3001 of the electronic device 300. According to an embodiment, the composite heat dissipation member 400 may include a first heat dissipation sheet 410 and a second heat dissipation sheet 420. The composite heat dissipation member 400 according to an embodiment may be formed in the shape of a single sheet which has a uniform thickness and is obtained from different kinds of heat dissipation sheets combined with each other. According to an embodiment, the first heat dissipation sheet 410 and the second heat dissipation sheet 420 may be formed of different materials and combined with each other along a certain boundary without being overlapped with each other, thereby forming a single sheet shape. According to an embodiment, the first and second heat dissipation sheets 410 and 420 may be formed through chemical bonding such as welding. According to an embodiment, when viewed from above the rear plate (e.g., the rear plate 380 in FIG. 3) of the electronic device 300, the first and second heat dissipation sheets 410 and 420 may be disposed to adjoin, at least in part, each other without any overlap. Thus, the first and second heat dissipation sheets 410 and 420 may be formed to have the same height. According to an embodiment, materials of the first and second heat dissipation sheets 410 and 420 may be selected in consideration of the characteristics of various electronic components (e.g., a processor, such as an AP, and/or an antenna) disposed in the inner space 3001 of the electronic device 300, and the boundary between the first and second heat dissipation sheets 410 and 420 may be determined such that the first or second heat dissipation sheet 410 or 420 is positioned in accordance with the characteristics of the electronic components. For example, while both the first and second heat dissipation sheets 410 and 420 may be formed of materials having a thermal conductivity of a predetermined level or more, one of both may be formed of a material having no electromagnetic shielding property. Specifically, the first heat dissipation sheet 410 may be formed of a composite material containing boron nitride (BN) (e.g., boron nitride ceramic), and the second heat dissipation sheet 420 may be formed of a composite material containing graphite. In this case, when viewed from above the rear plate 380, the first heat dissipation sheet 410 may be disposed at a position overlapped at least in part with at least one antenna radiator 451 that is disposed in the inner space 3001 and operates in a specific frequency band (about 800 MHz to about 6000 MHz) (e.g., a legacy band).

In the electronic device 300 according to an embodiment, various components that generate heat during operation may be arranged, and heat dissipation from these components may be very important in order to secure operational reliability of the components. For example, electronic components that generate heat during operation, such as the application processor (AP), the battery 350, or the antenna radiator 451, may be disposed in the electronic device 300. According to an embodiment, the antenna radiator 451 may include a laser direct structuring (LDS) pattern formed on a dielectric structure 450 disposed in the inner space 3001 of the electronic device 300. In another embodiment, the antenna radiator 451 may include a conductive pattern formed on a printed circuit board (e.g., the PCB 340 in FIG. 3) disposed in the inner space 3001 of the electronic device 300. The composite heat dissipation member 400 according to an embodiment may be disposed inside the electronic device 300 to perform heat dissipation from such electronic components.

The composite heat dissipation member 400 according to an embodiment may be made of different materials in consideration of the characteristics of adjacent electronic components, and each material of the composite heat dissipation member 400 may be arranged in consideration of the location of each adjacent electronic component. For example, the antenna radiator 451 has a characteristic that the radiation performance of a signal for communication is affected by the dielectric constant of a dielectric structure disposed around. On the other hand, the battery 350 and the AP may have characteristics that are relatively less affected by the dielectric constant than the antenna radiator 451. Therefore, when viewed from above the rear plate, the composite heat dissipation member 400 according to an embodiment may be disposed such that the first heat dissipation sheet 410 made of a material (e.g., boron nitride) having a low dielectric constant is located in a region overlapped with the antenna radiator 451 and such that the second heat dissipation sheet 420 made of a material (e.g., graphite) having a high thermal conductivity is located in a region overlapped with the battery 350 or the AP. As such, disposing the composite heat dissipation member 400 made of different materials in consideration of the characteristics of electronic components disposed in the electronic device 300 can maximize the heat dissipation efficiency of the electronic device 300.

Figure 6:
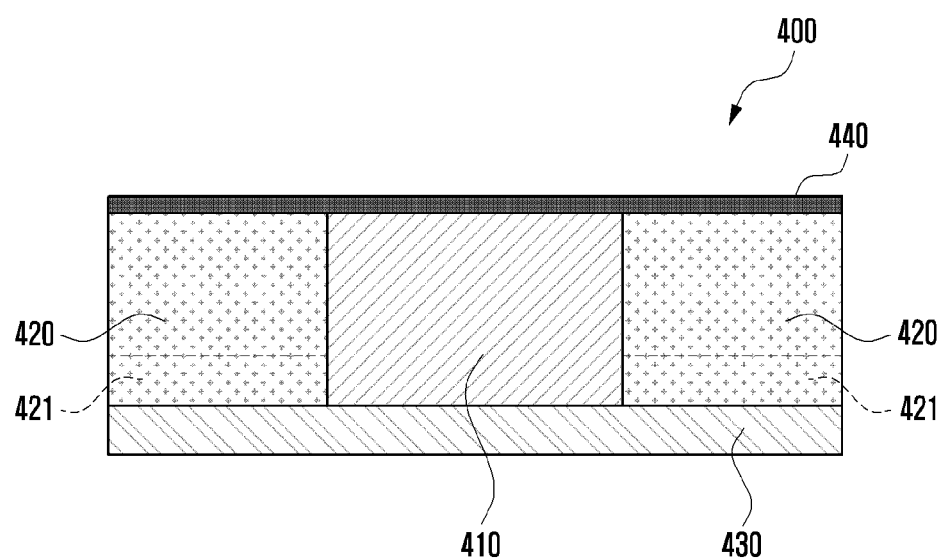
FIG. 6 illustrates a cross-sectional view of a composite heat dissipation member according to an embodiment of the disclosure.

FIG. 6 illustrates a cross-sectional view of a composite heat dissipation member 400 according to an embodiment of the disclosure.

Referring to FIG. 6, the composite heat dissipation member 400 according to an embodiment may further include a base layer 430 and an anti-delamination layer 440. The base layer 430 according to an embodiment may have one surface on which the first and second heat dissipation sheets 410 and 420 are stacked, and the other surface on which an adhesive layer (not shown) is formed to be attached to an electronic device (e.g., the electronic device 300 in FIG. 4). The base layer 430 according to an embodiment may be formed as a thin film made of a polyethylene terephthalate (PET) material, offer a basic frame of the composite heat dissipation member 400, and perform a function of a waterproof tape together with the adhesive layer (not shown) formed on the other surface. In another embodiment, the second heat dissipation sheet 420 may have an adhesive layer 421 to be attached to the base layer 430. In this case, the second heat dissipation sheet 420 may be formed such that the entire thickness including the thickness of the adhesive layer 421 is substantially the same as the thickness of the first heat dissipation sheet 410.

The anti-delamination layer 440 according to an embodiment may be stacked on the first and second heat dissipation sheets 410 and 420 not only to prevent the first and second heat dissipation sheets 410 and 420 from being damaged (e.g., cracked or delaminated), but also to reduce the influence of the first and second heat dissipation sheets 410 and 420 on other components. For example, the anti-delamination layer 440 may prevent the heat dissipation sheets from being damaged by contact or friction with other structures in the electronic device 300, and also prevent the heat dissipation sheets from affecting other components by heat conduction.

In the composite heat dissipation member 400 according to an embodiment, the first and second heat dissipation sheets 410 and 420 may be continuously formed with the same thickness on the same layer. In other words, although being made of different materials such as the first and second heat dissipation sheets 410 and 420, the composite heat dissipation member 400 according to an embodiment may be formed smoothly as a single sheet in appearance.

The composite heat dissipation member 400 according to an embodiment may receive heat directly through contact with electronic components (e.g., the processor and/or the antenna radiator 451) of the electronic device 300 and/or receive heat indirectly through air, and diffuse the received heat, thereby lowering the temperature of a heating hot spot generated by the electronic components. For example, the first heat dissipation sheet 410 may receive heat from the antenna radiator 451 and transfer the received heat to the second heat dissipation sheet 420 having a higher thermal conductivity. Then, the second heat dissipation sheet 420 may transfer heat to an adjacent component such as the battery 350. As a result, heat can be dissipated from the antenna radiator 451.

If the first heat dissipation sheet 410 is partially overlapped with the second heat dissipation sheet 420 instead of being formed on the same layer as the second heat dissipation sheet 420 as shown in FIG. 6, the first heat dissipation sheet 410 may have difficulty in getting close contact with the electronic component. This may reduce the thermal conductivity. In addition, such an overlap between the first and second heat dissipation sheets 410 and 420 may require an adhesive material, which may cause a heat resistance between the first and second heat dissipation sheets 410 and 420 and also lower the thermal conductivity.

Thus, according to an embodiment, the composite heat dissipation member 400 may be manufactured in the form of a single sheet through a method of coating and curing the first heat dissipation sheet 410 in a liquid or gel state in a removed portion of the second heat dissipation sheet 420. This method allows the first and second heat dissipation sheets 410 and 420 to be integrally formed as one sheet, improves the adhesion between the first heat dissipation sheet 410 and the electronic component, and reduces the heat resistance between the first and second heat dissipation sheets 410 and 420.

According to various embodiments, the composite heat dissipation member 400 may be formed such that the first and second heat dissipation sheets 410 and 420 have different heights while being disposed side by side without any overlap. Such a stepped structure composed of the first and second heat dissipation sheets 410 and 420 having different heights may be applied to flexibly cope with electronic components with different heights disposed inside the electronic device 300.

Figure 7:
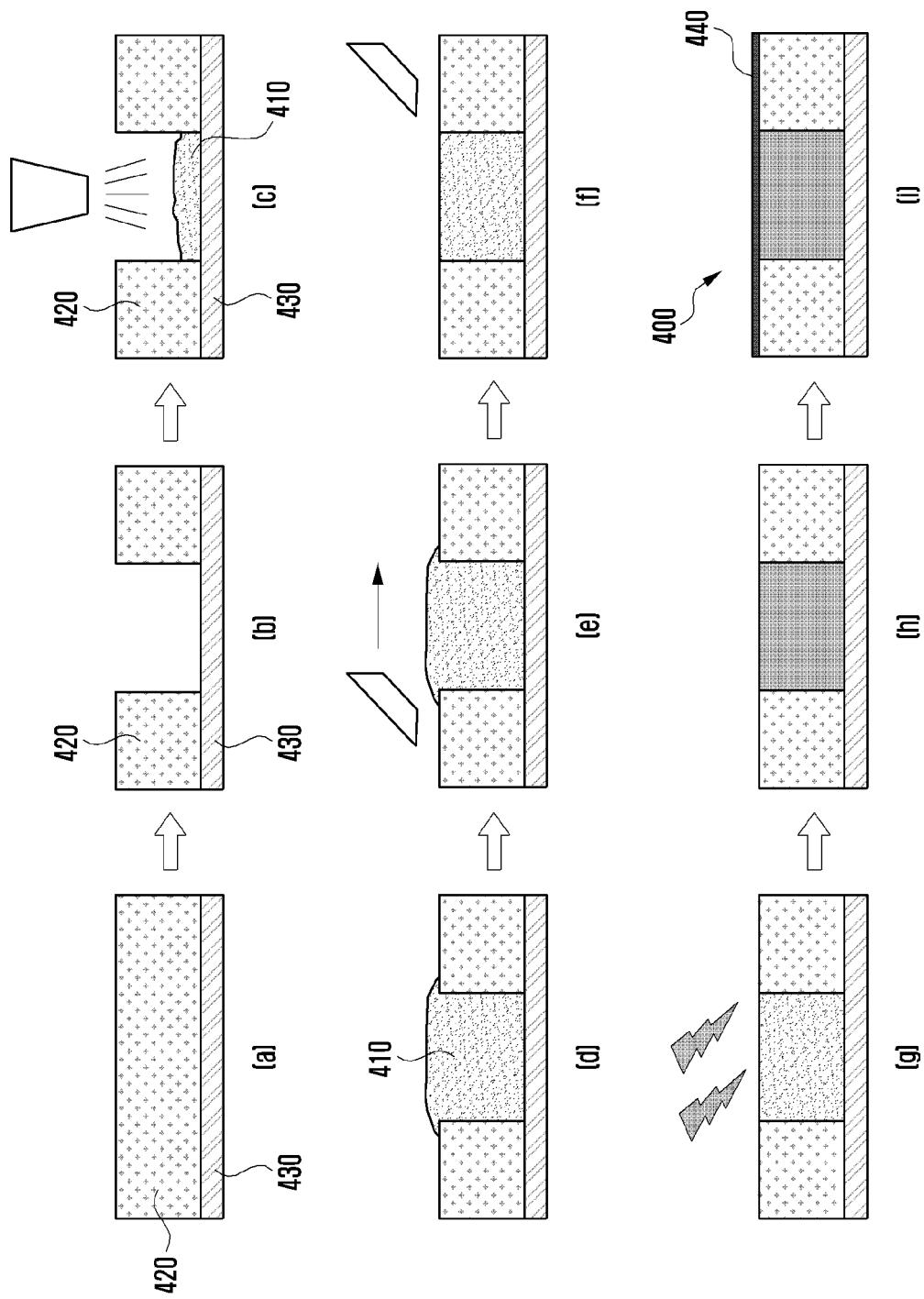
FIG. 7 illustrates a schematic view of a manufacturing process of a composite heat dissipation member according to an embodiment of the disclosure.

FIG. 7 illustrates a schematic view of a manufacturing process of a composite heat dissipation member 400 according to an embodiment of the disclosure.

According to an embodiment, a method for manufacturing the composite heat dissipation member 400 may include an operation of stacking the second heat dissipation sheet 420 on the base layer 430 as shown in (a), and an operation of removing a portion of the second heat dissipation sheet 420 as shown in (b). Alternatively, the second heat dissipation sheet 420 may be partially removed and then stacked on the base layer 430. As shown in (c) and (d), the method may further include an operation of coating the first heat dissipation sheet 410 in a liquid state in the removed portion of the second heat dissipation sheet 420. The liquid-state first heat dissipation sheet 410 may be a composite material containing boron nitride (BN). In order to form the first and second heat dissipation sheets 410 and 420 as one sheet by matching the coated first heat dissipation sheet 410 to the thickness of the second heat dissipation sheet 420, the method may further include an operation of performing planarization through a blade as shown in (e) and (f). In addition, as shown in (g) and (h), the method may further include an operation of curing the liquid-state first heat dissipation sheet 410 through a specific external stimulus. This specific external stimulus for the curing operation may be applying heat or irradiating near infrared rays. Also, as shown in (i), the method may further include an operation of forming the anti-delamination layer 440 on the first and second heat dissipation sheets 410 and 420. As described above, the anti-delamination layer 440 may not only prevent the first and second heat dissipation sheets 410 and 420 from being damaged (e.g., cracked or delaminated), but also reduce the influence of the first and second heat dissipation sheets 410 and 420 on other components.

Figure 8:
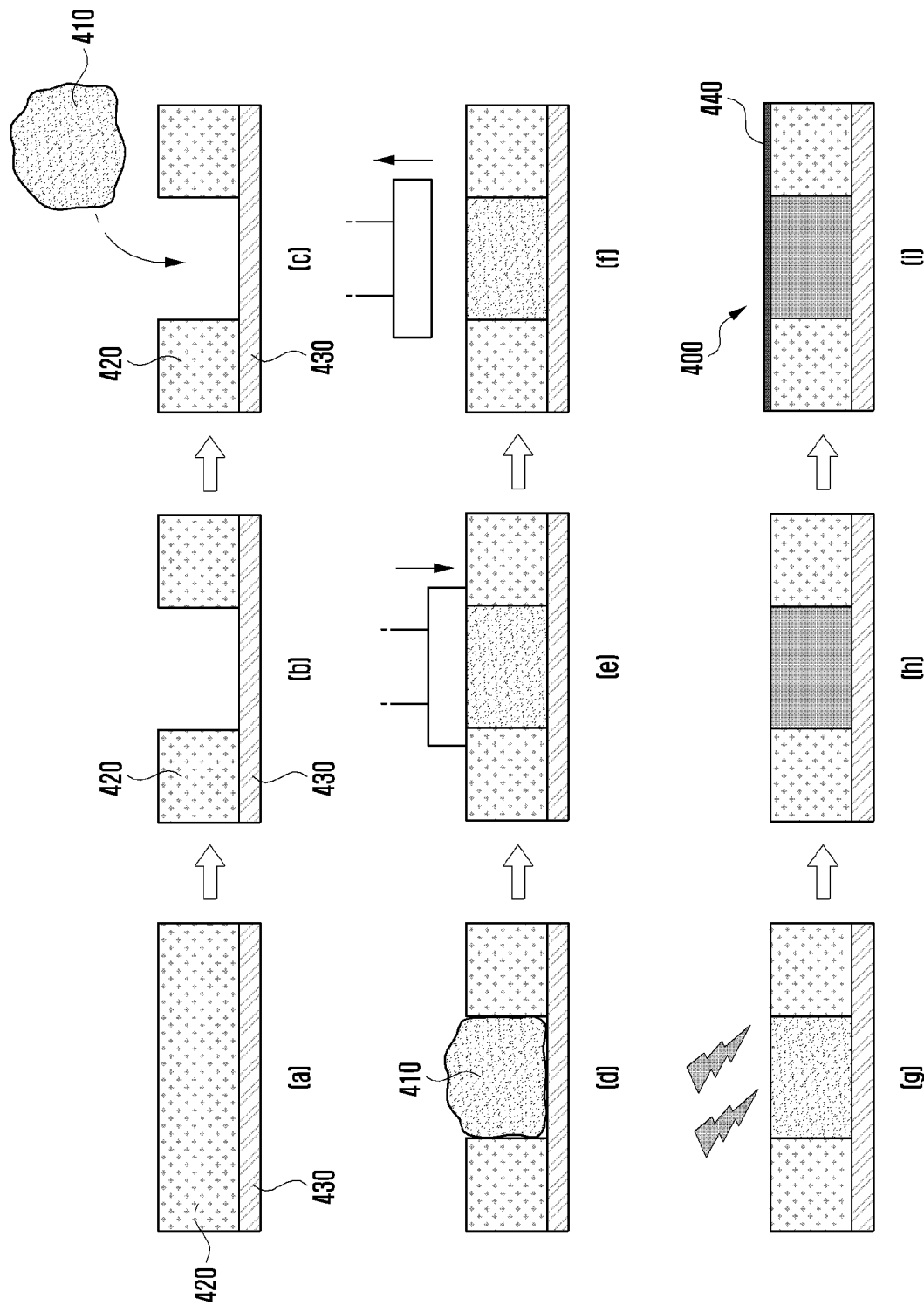
FIG. 8 illustrates a schematic view of a manufacturing process of a composite heat dissipation member according to another embodiment of the disclosure.

FIG. 8 illustrates a schematic view of a manufacturing process of a composite heat dissipation member 400 according to another embodiment of the disclosure.

According to another embodiment, a method for manufacturing the composite heat dissipation member 400 may include operations of stacking the second heat dissipation sheet 420 on the base layer 430 and removing a portion of the second heat dissipation sheet 420 as shown in (a) and (b). As shown in (c) and (d), the method may further include an operation of placing the first heat dissipation sheet 410 in a gel state in the removed portion of the second heat dissipation sheet 420. In order to form the first and second heat dissipation sheets 410 and 420 as one sheet by matching the gel-state first heat dissipation sheet 410 to the thickness of the second heat dissipation sheet 420, the method may further include an operation of performing planarization through compression as shown in (e) and (f). Measuring in advance the volume of the removed portion of the second heat dissipation sheet and then placing the first heat dissipation sheet 410 in an amount corresponding to the measured volume may allow the first heat dissipation sheet 410 to be planarized through compression to the same height as the second heat dissipation sheet 420. In addition, as shown in (g) and (h), the method may further include an operation of curing the gel-state first heat dissipation sheet 410 through a specific external stimulus. This specific external stimulus for the curing operation may be applying heat or irradiating near infrared rays. Also, as shown in (i), the method may further include an operation of forming the anti-delamination layer 440 on the first and second heat dissipation sheets 410 and 420. As described above, the anti-delamination layer 440 may not only prevent the first and second heat dissipation sheets 410 and 420 from being damaged (e.g., cracked or delaminated), but also reduce the influence of the first and second heat dissipation sheets 410 and 420 on other components.

Figure 9:
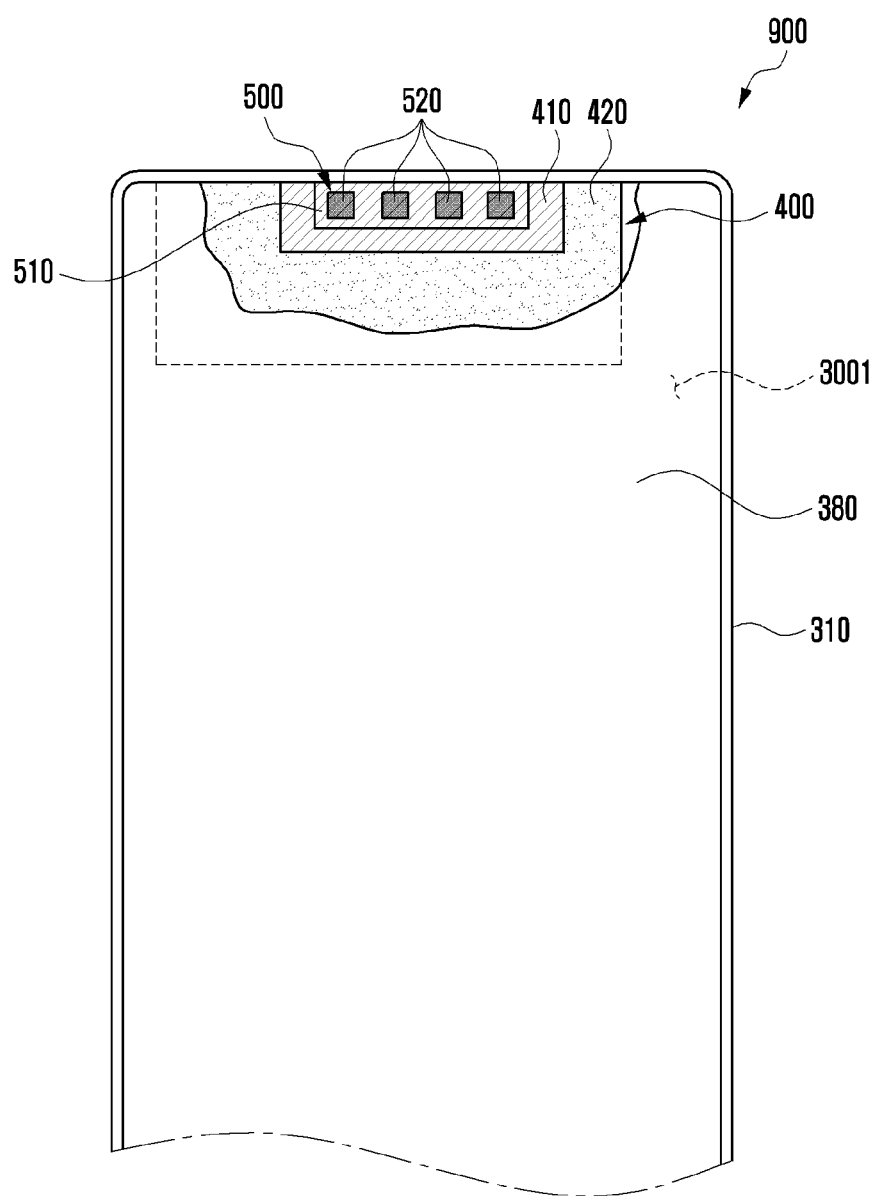
FIG. 9 illustrates a plan view of a state in which a composite heat dissipation member according to an embodiment of the disclosure is disposed around an antenna structure in an electronic device.

FIG. 9 illustrates a plan view of a state in which a composite heat dissipation member 400 according to an embodiment of the disclosure is disposed around an antenna structure 500 in an electronic device 900.

The electronic device 900 of FIG. 9 may be similar, at least in part, to the electronic device 100 of FIG. 1 or the electronic device 300 of FIG. 3, or may further include other embodiments of the electronic device.

FIG. 9 shows, in a state where the rear plate 380 of the electronic device 900 is omitted at least partially, the antenna structure 500 disposed in the inner space 3001 of the electronic device 900, and the composite heat dissipation member 400 disposed around the antenna structure 500.

Referring to FIG. 9, the electronic device 900 may include the antenna structure 500 disposed in the inner space 3001. According to an embodiment, the antenna structure 500 may include a printed circuit board (PCB) 510 and at least one antenna element 520 disposed on the PCB 510. According to an embodiment, the antenna element 520 may include a conductive patch or conductive pattern formed on the PCB 510. According to an embodiment, the antenna structure 500 may be configured to transmit and/or receive a radio signal of a super-high frequency band (e.g., a band of about 6 GHz to about 100 GHz) through a wireless communication circuit (not shown) disposed in the inner space 3001 of the electronic device 900. According to an embodiment, the antenna structure 500 may be disposed to form a beam pattern in a direction that the rear plate 380 faces.

According to various embodiments, the electronic device 900 may include the composite heat dissipation member 400 disposed to be overlapped at least in part with the antenna structure 500 when viewed from above the rear plate 380. According to an embodiment, the composite heat dissipation member 400 may have the substantially same configuration as that of the composite heat dissipation member 400 of FIG. 6. According to an embodiment, the composite heat dissipation member 400 may be disposed such that the first heat dissipation sheet 410 is overlapped with the antenna structure 500 when viewed from above the rear plate 380. In addition, the composite heat dissipation member 400 may be disposed such that when view from above the rear plate 380, the second heat dissipation sheet 420 is not overlapped with the antenna structure 500 and surrounds at least in part the antenna structure 500. Although not shown, the electronic device 900 may further include at least one electronic component (e.g., a processor) disposed in a region overlapped with the second heat dissipation sheet 420 and operating as a heat source. According to an embodiment, the first heat dissipation sheet 410 may be formed of a low-dielectric material such as boron nitride ceramic in order to prevent a decrease in radiation performance of the antenna structure 500. According to an embodiment, the second heat dissipation sheet 420 may be formed of a thermally conductive material such as graphite having a high thermal conductivity. For example, heat generated from the antenna structure 500 may quickly diffuse to the second heat dissipation sheet 420 through the first heat dissipation sheet 410, and also heat generated from an electronic component such as the processor may quickly diffuse to the first heat dissipation sheet 410 through the second heat dissipation sheet 420.

Figure 10A:
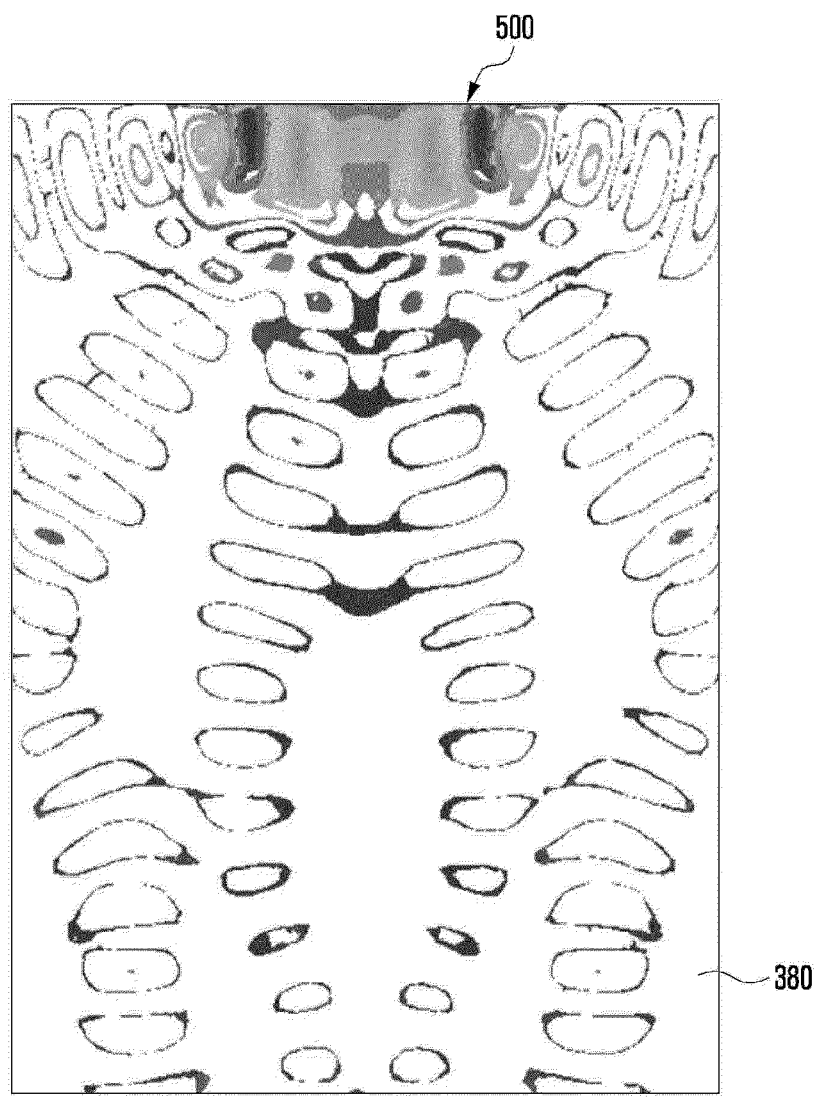
FIGS. 10A and 10B illustrate diagrams of radiation performance of an antenna before and after a composite heat dissipation member is applied to the electronic device of FIG. 9 according to an embodiment of the disclosure.
Figure 10B:
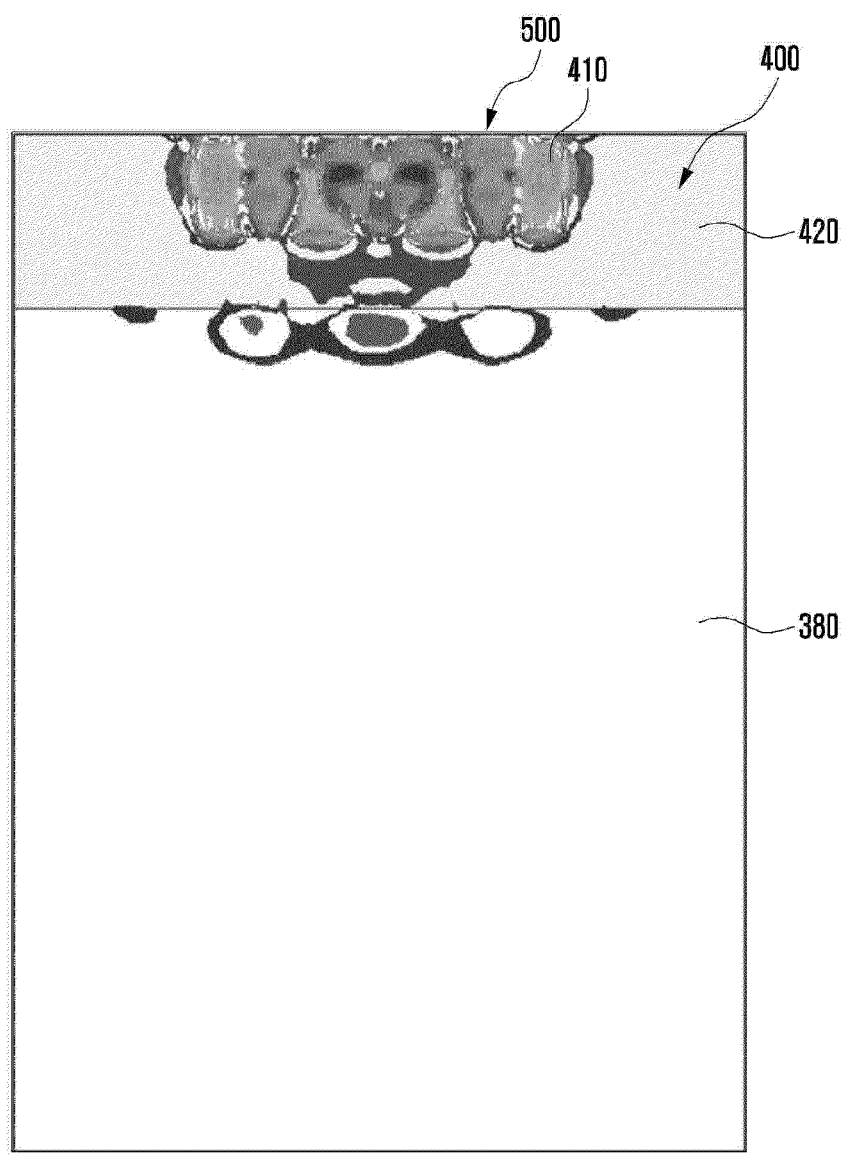

FIGS. 10A and 10B illustrate diagrams of radiation performance of an antenna structure 500 before and after a composite heat dissipation member 400 is applied to the electronic device 900 of FIG. 9 according to an embodiment of the disclosure.

In case of the antenna structure 500 of FIG. 10A in which the composite heat dissipation member is not disposed, it can be seen that the rear plate 380 made of a dielectric material serves as a wave guide and thereby induces a signal in an unnecessary direction.

In case of the antenna structure 500 of FIG. 10B in which the composite heat dissipation member 400 is disposed, it can be seen that the second heat dissipation sheet 420 shields a signal from being induced in an unnecessary direction, so that the composite heat dissipation member 400 disposed around the antenna structure 500 not only performs heat dissipation, but also improves antenna radiation performance.

Figure 11:
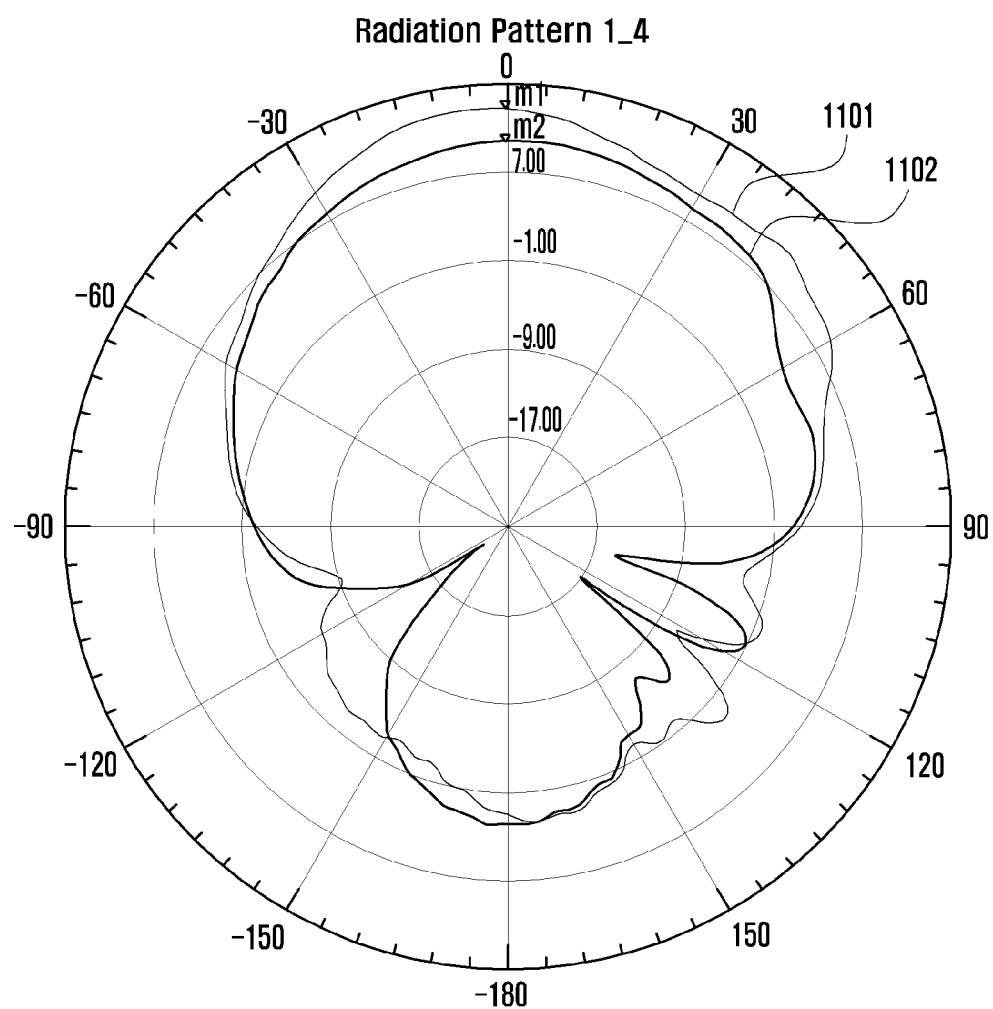
FIG. 11 illustrates a diagram of radiation patterns of an antenna before and after a composite heat dissipation member is applied to the electronic device of FIG. 9 according to an embodiment of the disclosure.

FIG. 11 illustrates a diagram of radiation patterns of an antenna structure 500 before and after a composite heat dissipation member 400 is applied to the electronic device 900 of FIG. 9 according to an embodiment of the disclosure.

Referring to FIG. 11, it can be seen that in a radiation direction (e.g., the direction that the rear plate 380 faces), the radiation performance is improved by about 3 dB in case of using the composite heat dissipation member 400 (see a graph 1101) compared to case of using no composite heat dissipation member (see a graph 1102). This means that the energy of a signal induced in an unnecessary direction is shielded and instead delivered in a main radiation direction.

As described hereinbefore, using the composite heat dissipation member made of different materials in consideration of the characteristics of electronic components (e.g., the antenna module or the processor) disposed in the electronic device can maximize the heat dissipation efficiency of the electronic device. In addition, because the heat dissipation sheets of different materials are formed in a single sheet shape, there is no need for a separate adhesive member for combining the sheets, and heat resistance between the heat dissipation sheets can be reduced.

According to various embodiments, a composite heat dissipation member (e.g., the composite heat dissipation member 400 in FIG. 4) may include a first heat dissipation sheet (e.g., the first heat dissipation sheet 410 in FIG. 4) disposed to be overlapped with an antenna module (e.g., the antenna radiator 451 in FIG. 4), and a second heat dissipation sheet (e.g., the second heat dissipation sheet 420 in FIG. 4) disposed adjacent to the first heat dissipation sheet without an overlap with the first heat dissipation sheet, thermally connected to the first heat dissipation sheet, and having a higher thermal conductivity than the first heat dissipation sheet.

According to various embodiments, the composite heat dissipation member may further include a base layer (e.g., the base layer 430 in FIG. 6) having one surface on which the first heat dissipation sheet and the second heat dissipation sheet are stacked.

According to various embodiments, the composite heat dissipation member may further include an anti-delamination layer (e.g., the anti-delamination layer 440 in FIG. 6) stacked on the first and second heat dissipation sheets to prevent the first and second heat dissipation sheets from being damaged.

According to various embodiments, the first heat dissipation sheet may be cured by a specific external stimulus in a liquid state.

According to various embodiments, the first heat dissipation sheet may be formed by removing a portion of the second heat dissipation sheet, coating a liquid-state first heat dissipation sheet in the removed portion, and curing the liquid-state first heat dissipation sheet.

According to various embodiments, the first heat dissipation sheet may be cured by a specific external stimulus in a gel state.

According to various embodiments, the first heat dissipation sheet may be formed by removing a portion of the second heat dissipation sheet, placing a gel-state first heat dissipation sheet in the removed portion, and compressing and curing the gel-state first heat dissipation sheet.

According to various embodiments, an electronic device (e.g., the electronic device 300 in FIG. 4) may include a housing (e.g., the lateral bezel structure 310 in FIG. 4), an antenna module (e.g., the antenna radiator 451 in FIG. 4) embedded in the housing, and a composite heat dissipation member (e.g., the composite heat dissipation member 400 in FIG. 4) thermally connected at least to the antenna module. The composite heat dissipation member may include a first heat dissipation sheet (e.g., the first heat dissipation sheet 410 in FIG. 4) disposed to be overlapped with the antenna module, and a second heat dissipation sheet (e.g., the second heat dissipation sheet 420 in FIG. 4) disposed adjacent to the first heat dissipation sheet without an overlap with the first heat dissipation sheet, thermally connected to the first heat dissipation sheet, and having a higher thermal conductivity than the first heat dissipation sheet.

According to various embodiments, the composite heat dissipation member may further include a base layer having one surface on which the first heat dissipation sheet and the second heat dissipation sheet are stacked.

According to various embodiments, the composite heat dissipation member may further include an anti-delamination layer stacked on the first and second heat dissipation sheets to prevent the first and second heat dissipation sheets from being damaged.

According to various embodiments, the first heat dissipation sheet may be cured by a specific external stimulus in a liquid state.

According to various embodiments, the first heat dissipation sheet may be formed by removing a portion of the second heat dissipation sheet, coating a liquid-state first heat dissipation sheet in the removed portion, and curing the liquid-state first heat dissipation sheet.

According to various embodiments, the first heat dissipation sheet may be cured by a specific external stimulus in a gel state.

According to various embodiments, the first heat dissipation sheet may be formed by removing a portion of the second heat dissipation sheet, placing a gel-state first heat dissipation sheet in the removed portion, and compressing and curing the gel-state first heat dissipation sheet.

According to various embodiments, a method for manufacturing a composite heat dissipation member may include stacking, on a base layer, a second heat dissipation sheet a portion of which is removed, disposing a first heat dissipation sheet in the removed portion of the second heat dissipation sheet, performing planarization to match the first heat dissipation sheet to a thickness of the second heat dissipation sheet, and curing the first heat dissipation sheet.

According to various embodiments, the method may further include forming an anti-delamination layer on the first and second heat dissipation sheets.

According to various embodiments, disposing the first heat dissipation sheet may include coating the first heat dissipation sheet in a liquid state, and performing the planarization may include partially removing the first heat dissipation sheet through a blade in accordance with the thickness of the second heat dissipation sheet.

According to various embodiments, curing the first heat dissipation sheet may include applying heat or irradiating near infrared rays to the first heat dissipation sheet.

According to various embodiments, disposing the first heat dissipation sheet may include placing the first heat dissipation sheet in a gel state, and performing the planarization may include compressing the first heat dissipation sheet in accordance with the thickness of the second heat dissipation sheet.

According to various embodiments, curing the first heat dissipation sheet may include applying heat or irradiating near infrared rays to the first heat dissipation sheet.

Although the present disclosure has been described with various embodiments, various changes and modifications may be suggested to one skilled in the art. It is intended that the present disclosure encompass such changes and modifications as fall within the scope of the appended claims.

What is claimed is:

1. A composite heat dissipation member comprising:
   a first heat dissipation sheet disposed to be overlapped with an antenna module;
   a second heat dissipation sheet disposed adjacent to the first heat dissipation sheet without an overlap with the first heat dissipation sheet, the second heat dissipation sheet thermally connected to the first heat dissipation sheet; and an anti-delamination layer stacked on the first and second heat dissipation sheets to prevent the first and second heat dissipation sheets from being damaged, wherein the second heat dissipation sheet has a higher thermal conductivity than the first heat dissipation sheet.

2. The composite heat dissipation member of claim 1, further comprising:

a base layer comprising one surface on which the first heat dissipation sheet and the second heat dissipation sheet are stacked.

3. The composite heat dissipation member of claim 1, wherein the first heat dissipation sheet is cured by a specific external stimulus in a liquid state.

4. The composite heat dissipation member of claim 3, wherein the first heat dissipation sheet is formed by removing a portion of the second heat dissipation sheet, coating a liquid-state first heat dissipation sheet in the removed portion, and curing the liquid-state first heat dissipation sheet.

5. The composite heat dissipation member of claim 1, wherein the first heat dissipation sheet is cured by a specific external stimulus in a gel state.

6. The composite heat dissipation member of claim 5, wherein the first heat dissipation sheet is formed by removing a portion of the second heat dissipation sheet, placing a gel-state first heat dissipation sheet in the removed portion, and compressing and curing the gel-state first heat dissipation sheet.

7. An electronic device comprising:

a housing;

an antenna module embedded in the housing; and a composite heat dissipation member thermally connected at least to the antenna module, wherein the composite heat dissipation member comprises:

a first heat dissipation sheet disposed to be overlapped with the antenna module;

a second heat dissipation sheet disposed adjacent to the first heat dissipation sheet without an overlap with the first heat dissipation sheet, the second heat dissipation sheet thermally connected to the first heat dissipation sheet; and an anti-delamination layer stacked on the first and second heat dissipation sheets to prevent the first and second heat dissipation sheets from being damaged, wherein the second heat dissipation sheet has a higher thermal conductivity than the first heat dissipation sheet.

8. The electronic device of claim 7, wherein the composite heat dissipation member further includes:

a base layer comprising one surface on which the first heat dissipation sheet and the second heat dissipation sheet are stacked.

9. The electronic device of claim 7, wherein the first heat dissipation sheet is cured by a specific external stimulus in a liquid state.

10. The electronic device of claim 9, wherein the first heat dissipation sheet is formed by removing a portion of the second heat dissipation sheet, coating a liquid-state first heat dissipation sheet in the removed portion, and curing the liquid-state first heat dissipation sheet.

11. The electronic device of claim 7, wherein the first heat dissipation sheet is cured by a specific external stimulus in a gel state.

12. The electronic device of claim 11, wherein the first heat dissipation sheet is formed by removing a portion of the second heat dissipation sheet, placing a gel-state first heat dissipation sheet in the removed portion, and compressing and curing the gel-state first heat dissipation sheet.

13. A method for manufacturing a composite heat dissipation member, the method comprising:

stacking, on a base layer, a second heat dissipation sheet a portion of which is removed;

disposing a first heat dissipation sheet in the removed portion of the second heat dissipation sheet;

performing planarization to match the first heat dissipation sheet to a thickness of the second heat dissipation sheet; and curing the first heat dissipation sheet.

14. The method of claim 13, further comprising:

forming an anti-delamination layer on the first and second heat dissipation sheets.

15. The method of claim 14, wherein:

disposing the first heat dissipation sheet includes coating the first heat dissipation sheet in a liquid state, and performing the planarization includes partially removing the first heat dissipation sheet through a blade in accordance with the thickness of the second heat dissipation sheet.

16. The method of claim 15, wherein curing the first heat dissipation sheet includes applying heat or irradiating near infrared rays to the first heat dissipation sheet.

17. The method of claim 14, wherein:

disposing the first heat dissipation sheet includes placing the first heat dissipation sheet in a gel state, and performing the planarization includes compressing the first heat dissipation sheet in accordance with the thickness of the second heat dissipation sheet.

18. The method of claim 17, wherein curing the first heat dissipation sheet includes applying heat or irradiating near infrared rays to the first heat dissipation sheet.

* * * * *